United States Patent
Hughes et al.

[11] Patent Number: 5,745,400
[45] Date of Patent: Apr. 28, 1998

[54] CURRENT MEMORY

[75] Inventors: John B. Hughes, Hove; Kenneth W. Moulding, Horley, both of England

[73] Assignee: U.S. Philips Corporation, New York, N.Y.

[21] Appl. No.: 708,159

[22] Filed: Aug. 27, 1996

[30] Foreign Application Priority Data

Aug. 31, 1995 [GB] United Kingdom ............ 9517785

[51] Int. Cl.$^6$ ........................................ G11C 13/00
[52] U.S. Cl. ................................ 365/45; 365/149
[58] Field of Search ........................... 365/45, 149

[56] References Cited

U.S. PATENT DOCUMENTS

| | | | |
|---|---|---|---|
| 4,094,007 | 6/1978 | Minami | 365/45 |
| 4,272,831 | 6/1981 | Ulrich | 365/45 |
| 5,027,171 | 6/1991 | Reedy et al. | 365/45 |

*Primary Examiner*—Son T. Dinh
*Attorney, Agent, or Firm*—Steven R. Biren

[57] ABSTRACT

A current memory comprises an input which is connected via a switch which is closed on a phase $\phi 1$ of a clock signal to inputs of a coarse memory cell (M1) and a fine memory cell (M2). The coarse memory cell samples the input current on phase $\phi 1a$ of the clock and outputs a current thereafter. The fine memory cell senses the difference between the input current and the output of the coarse memory on phase $\phi 1b$ of the clock. A second switch which is closed on phase $\phi 2$ of the clock passes the combined outputs of the coarse and fine memories to an output. Two further switches are provided which are closed for a short time (sh1) at the start of phase $\phi 1b$. The two further switches discharge the stray capacitance ($C_n$) at the node (2) to the voltage reference source via a terminal.

14 Claims, 5 Drawing Sheets

CURRENT MEMORY

BACKGROUND OF THE INVENTION

This invention relates to an analog current memory comprising a first, coarse, current memory cell comprising a field effect transistor having a first switch connected between its drain and gate electrodes, and a second, fine, current memory cell comprising a second field effect transistor having a second switch connected between its gate electrode and a bias potential source, means for applying an input current to be stored to the inputs of the first and second current memory cells, means for applying output currents from the first and second current memory cells to a summing node, and means for deriving a stored current from the summing node, wherein the first and third switches are closed for a first period during the application of the input current and the second switch is closed for a second period during the application of the input current;

Such an analogue current memory is disclosed in EP-A-0608936 corresponding to U.S. Pat. No. 5,400,273; (PHB 33830). While this current memory, which has been referred to as an $S^2I$ current memory, gives a better performance than the simple current memory earlier proposed for switched current circuits and shown in FIG. 3.4 at Page 36 of the book edited by C. Toumazou, J. B. Hughes, and N. C. Battersby entitled "SWITCHED-CURRENTS an analogue technique for digital technology" and published by Peter Peregrinus Limited in 1993, it still does not give ideal performance.

SUMMARY OF THE INVENTION

It is an object of the invention to provide an analog current memory as set forth in the opening paragraph and as disclosed in EP-A-0608936 which produces a more accurate replica of the input current at its output.

According to a first aspect the invention provides an analog current memory as set forth in the opening paragraph characterised in that the current memory further comprises means for connecting a discharge path for the capacitance at the summing node for an initial portion of the second period, said discharge path causing at least some of the charge on said capacitance to be discharged other than through the second transistor.

In the current memory described in EP-A-0608936 the sampling operation is made in two steps: a coarse step in which the input sample is memorized approximately in an nmost memory cell followed by a fine step during which the error of the coarse step is derived and memorized in a pmost memory cell. The output is then delivered from both nmost and pmost memory cells so that the error is subtracted to leave an accurate replica of the input sample. When parasitic capacitance is present at the junction of the nmost and pmost memory cells (the summing node S), the operation is disturbed in the following manner.

During the first period ($\phi 1a$) the pmost's gate is connected to the bias potential source ($V_{ref}$) and generates a bias current J. The diode-connected nmost coarsely samples the current J+i, where i is the input current, along with errors due to non-ideal behaviour of the most's. The voltage at the summing node S is $VSN=V_{gsN}$ that is the gate-source potential of the nmost which is signal dependent.

During the second period ($\phi 1b$), the current in the nmost is $I_N=J+i+\delta i$. The current in the pmost settles towards $I_p=J+\delta i$ and the voltage at the summing node is $V_{SP}=V_{dd}-V_{gsP}$ where $V_{gsP}$ is the gate-source potential to the pmost, which is nearly independent of signal amplitude $\delta i$ is small.

So necessarily $V_{SN} \neq V_{SP}$ and there is an inevitable step in the value of the voltage on the summing node at the start of phase $\phi 1b$. This causes an extra current to flow from the parasitic capacitance at the summing node into the diode-connected pmost.

While $I_p$ will recover from this charging current it inevitably takes additional time requiring an increased duration of phase $\phi 1b$, or if an increased duration is unacceptable it produces an extra settling error. This has the effect of either reducing the maximum operating frequency or increasing the transmission error.

The invention is based on the realisation that the change in the value of the voltage at the summing node when the first and third switches open and the second switch closes and the parasitic capacitance at the summing node causes an extra current to flow into the transistor forming the fine memory cell and consequently increases the settling time. By providing an alternative discharge path from the summing node for a short time at the start of the second period for the parasitic capacitance, this discharge has less effect on the settling time of the fine current memory.

The discharge path may comprise the second and third switches, the third switch being closed for the initial portion of the second period.

Alternatively, the discharge path may comprise a fourth switch which is closed for the initial portion of the second period, the fourth switch being connected between the bias potential source and summing node.

The first alternative has the advantage that no additional switches are required, merely a change in the control waveform for the third switch, but its performance is limited since much of the discharge current will still pass through the second transistor as the discharge path through the second and third switches to the bias potential source is not particularly effective. By providing a fourth switch, which may be designed to have a low "on" resistance, a more effective discharge path can be provided which quickly discharges the parasitic capacitance at the summing node thereby providing a shorter settling time for the fine memory transistor.

The discharge path may or may additionally comprise a fifth switch connected in parallel with the third switch, the fifth switch being closed for the initial portion of the second period.

This has the advantage that the fifth switch may be constructed to have a low "on" resistance, whereas the third switch is advantageously constructed using minimum dimensions to limit charge injection onto the gate-source capacitance of the second transistor as it opens at the end of the first period.

According to the second aspect the invention provides an analogue current memory for differential input currents comprising first and second current memories according to the first aspect of the invention in which a discharge path for the capacitance at the summing nodes of the first and second current memories is provided by connecting together the summing nodes of the first and second current memories for the initial portion of the second period.

With a differential memory of this form the summing node of one memory will be at a potential above $V_{ref}$ while that of the other summing node will be at a potential below $V_{ref}$ and these potentials will be balanced about $V_{ref}$ in the absence of common mode signals. Thus, by connecting the nodes together the parasitic capacitance at one node will discharge into that at the other node. It is advantageous to provide the other discharge paths in addition, that is via the fourth and fifth switches in each memory to maximize the rate of discharge of this capacitance and to be effective where common mode voltages are produced.

BRIEF DESCRIPTION OF THE DRAWINGS

The above and other features and advantages of the invention will be further explained by the following description of embodiments of the invention, by way of example, with reference to the accompanying drawings, in which.

DESCRIPTION OF THE PREFERRED EMBODIMENTS

Figure 1:
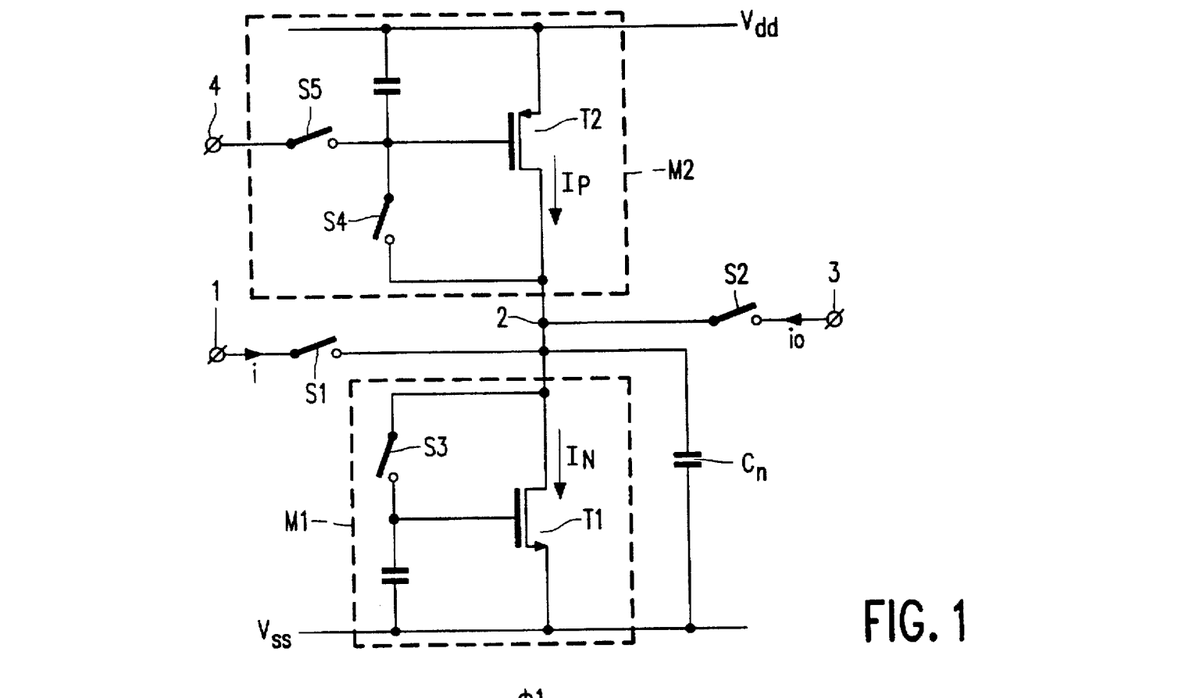
FIG. 1 is a circuit diagram of a prior art current memory as disclosed in EP-A-0608936.
Figure 7:
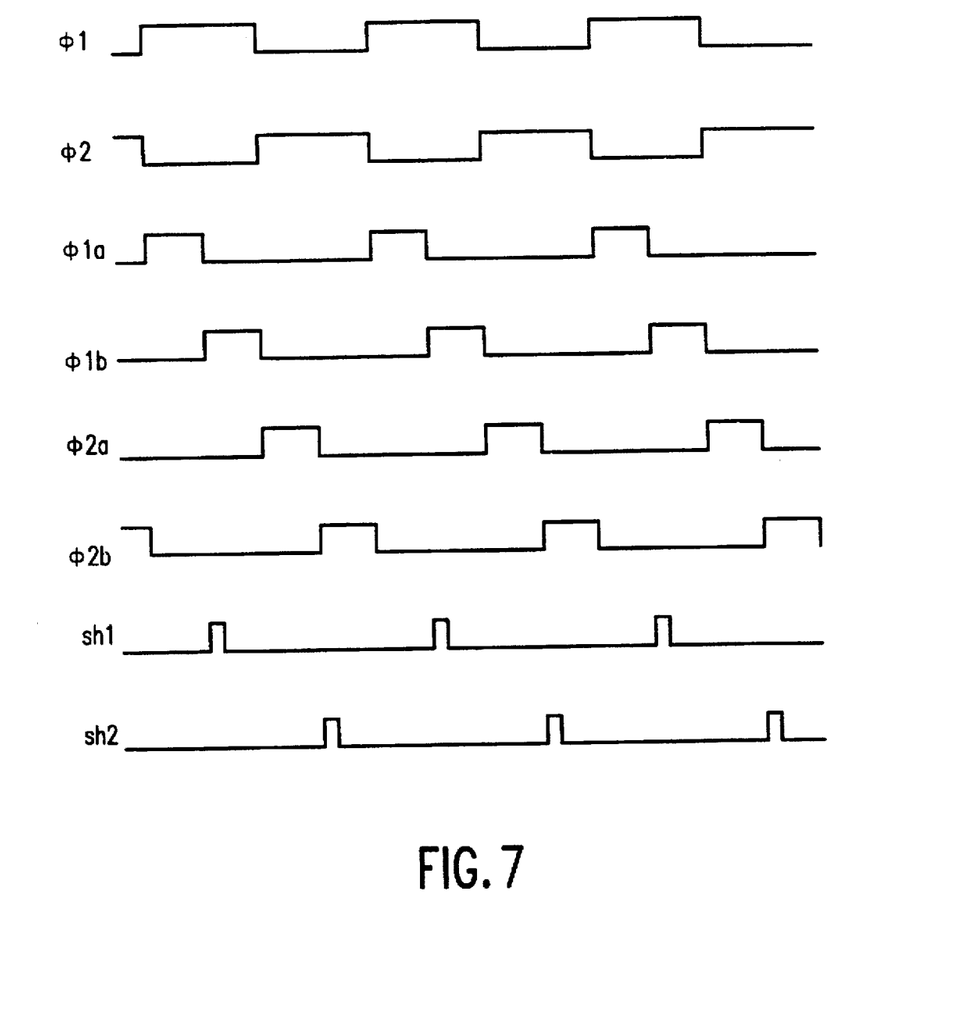
FIG. 7 shows clock waveforms used for operating the various switches in the current memories and integrator shown in FIGS. 1, 3 5 and 6.

As shown in FIG. 1 the current memory has an input 1 to which an input current i is applied. The input 1 is connected via a switch S1 to a summing node 2. The current memory further has an output 3 which is connected to the summing node via a switch S2. The current memory comprises a first, coarse, current memory cell M1 and a second, fine, current memory cell M2. The first current memory cell M1 comprises an N-channel field effect transistor T1 whose source electrode is connected to a supply rail $V_{ss}$ and whose drain electrode is connected to the summing node 2. A switch S3 is connected between the drain and gate electrodes of the transistor T1. The second memory cell M2 comprises a P-channel field effect transistor T2 whose source electrode is connected to a supply rail $V_{dd}$ and whose drain electrode is connected to the summing node 2. A switch S4 is connected between the drain and gate electrodes of transistor T2. A further switch S5 connects the gate electrode of transistor T2 to a terminal 4 to which a bias potential source $V_{ref}$ is applied. The switches Si to S5 are operated by clock waveforms which are illustrated in FIG. 7. Switch S1 is closed when clock waveform φ1 is high. Switches S3 and S5 are closed when clock waveform φ1a is high, switch S4 is closed when clock waveform φ1b is high, and switch S2 is closed when clock waveform φ2 is high.

During phase φ1 an input current i is applied to the inputs of the current memory cells M1 and M2, the inputs being formed by the drain electrodes of transistors T1 and T2 respectively. During phase φ1a the switch S5 is closed and causes a current J to be produced by the transistor T2. This is a bias current which enables bidirectional input currents to be handled by the current memory. At the same time the switch S3 is closed and the coarse memory M1 samples the input current. At the end of the phase φ1a the switch S3 opens and the current $I_N$ through transistor T1 is maintained by the charge on its gate-source capacitance. This current through transistor T1, $I_N$, is equal to i+J+δi where δi is an error current caused by non idealities in the transistor T1 and charge injection on to the gate source capacitance caused by the opening of switch S3. At the end of phase φ1a switches S3 and S5 open and at the beginning of phase φ1b switch S4 closes. The input current is still applied to the input of the memory cells M1 and M2. As the current through transistor T1, that is the current drawn by the current memory cell M1 is J+i+δi the current sensed by the fine memory cell M2 is J+δi. When the switch S4 opens at the end of phase φ1b the current J+δi is produced by the fine memory cell M2. Thus at the summing node 2 a current equal to i is produced and as switch S2 is now closed an output current i is produced at output 3.

Figure 2:
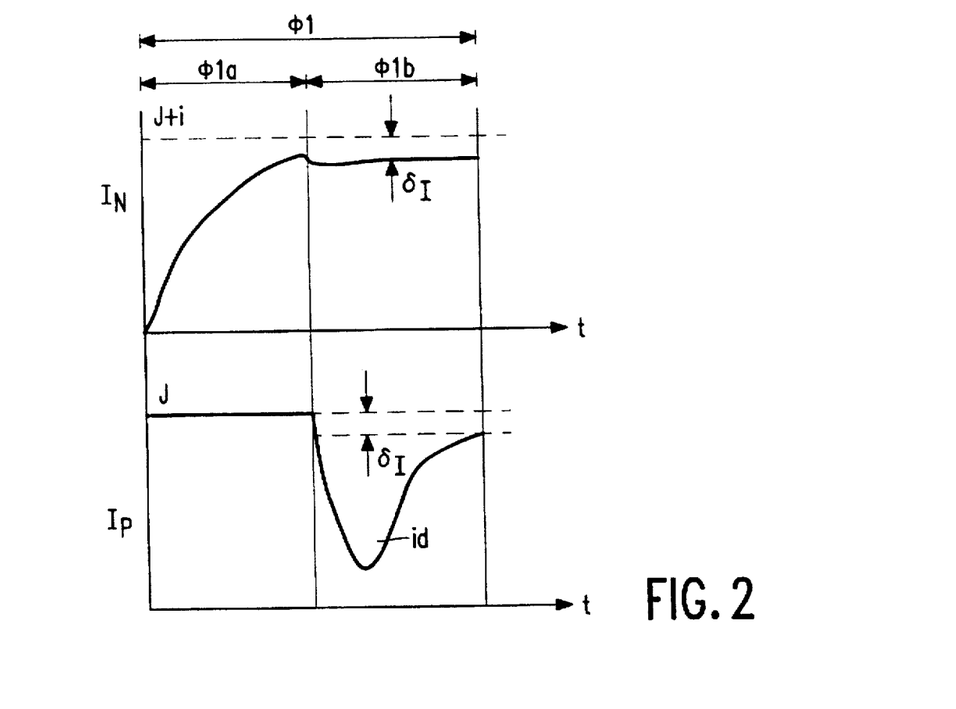
FIG. 2 shows current waveforms in the current memory of FIG. 1.

This description has ignored the presence of the parasitic capacitor $C_N$ at the node 2. As described earlier there is an inevitable step in the value of the voltage on the summing node 2 at the start of phase 100 1b. This causes an extra current to flow from the parasitic capacitor at the summing node 2 into the diode connected transistor T2. This effect is shown in FIG. 2 where the currents $I_N$ and $I_p$ represent the currents through transistors T1 and T2 respectively. It can be seen from a consideration of FIG. 2 that during phase φ1a the P-channel transistor T2 produces a current J which is determined by the value of the bias voltage $V_{ref}$. The current sensed by the N-channel transistor T1 gradually rises towards J+i, where i is the input current, but because transistor T1 is not ideal it does not actually reach the value J+i but in fact reaches a value of J+i+δi, where δi is an error current. The error current δi also includes a component due to charge injection when switch S3 opens. In phase 100 1b the coarse memory M1 will produce the current J+i+δi since the gate-drain switch S3 is now open and the current is maintained by the gate-source capacitance of transistor T1. The transistor T2 is now diode connected since the switch S4 is closed and senses the input current plus the current produced by the current memory cell M1. It also senses the discharge current id of the capacitor $C_N$. This causes an additional error current from which the fine memory cell M2 will eventually recover, but it requires time in order to do so. This will limit the speed of the clock signal, that is the minimum length of the φ1b period, if a given accuracy of reproduction of the input signal is required. Alternatively, if the φ1b period is fixed this will cause an additional error in the output current if the length of the φ1b period is not sufficient to allow the recovery.

Figure 3:
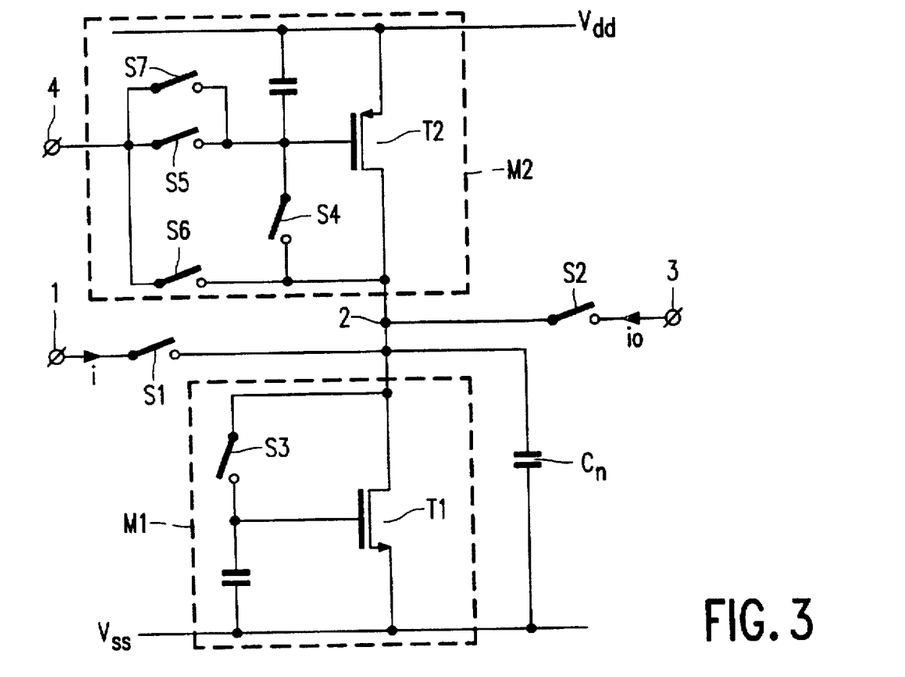
FIG. 3 is a circuit diagram of a first embodiment of a current memory according to the invention.

FIG. 3 shows an embodiment of a current memory according to the invention which includes means for overcoming the problem explained in the description of the embodiment of FIG. 1. In FIG. 3 those elements having the same form and function as those in FIG. 1 have been given corresponding reference signs. The current memory in FIG. 3 has been modified by the addition of two switches, S6 and S7. The switch S6 is connected between the summing node 2 and the bias voltage source $V_{ref}$. The switch S7 is connected in parallel with the switch S5. These two switches provide additional discharge paths from the summing node 2 to the reference voltage source $V_{ref}$. As a result the discharge of the parasitic capacitor $C_N$ can take place more rapidly and with less effect on the memory transistor T2. The switches S6 and S7 are closed for a short period sh1 at the beginning of the phase φ1b. As an alternative to providing the switch S7 the switch S5 may, instead of being controlled solely by the waveform φ1a also be controlled to remain closed for the short initial period of phase φ1b. In some applications it may be sufficient to provide only the discharge path provided by the switch S6. Alternatively, it may be acceptable merely to provide the discharge path provided by switches S4 and S5 if the switch S5 is closed during the short initial period of phase φ1b, or the switches S4 and S7. Clearly for best performance the provision of both switches S6 and S7 is preferable. The addition of switch S7 in parallel with switch S5 has the advantage that the switches may be appropriately dimensioned for the two different functions. That is the switch S5 may have the same dimensions as switch S4 to minimise, clock feed through as switches S4 and S5 operate with opposite direction clock edges. Switch S4 is normally given a minimum channel length but the width W is chosen to obtain the required settling response. The switch S7 may on the other hand be constructed to have a low "on" resistance so that a more effective discharge path is produced, the effect of its capacitance being minimal as charge injection is not important since transistor T2 is diode connected at the time switch S7 opens.

Figure 4:
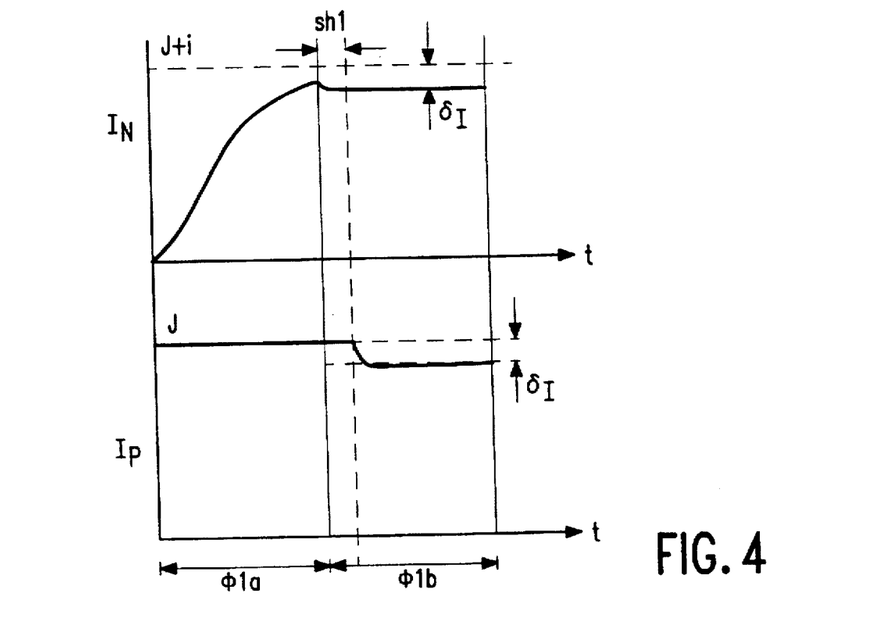
FIG. 4 shows current waveforms in the current memory of FIG. 3.

FIG. 4 illustrates how the improved performance from the current memory shown in FIG. 3 is produced. It will be seen that the current through the coarse memory cell M1 remains the same as for the embodiment of FIG. 1. However, the current through the transistor T2 is modified during the phase $\phi 1b$. During the short initial period of phase $\phi 1b$ the switches S6 and S7 serve to discharge the capacitance $C_N$ of the node 2. Thus the increase in current sensed by the transistor T2 is very much reduced enabling it to converge to the error current $\delta i$ in a much shorter time.

The two switches S6 and S7 close for a brief period, phase sh1 at the start of phase $\phi 1b$. That is when the discharge currents start to flow. In this way the discharge current is diverted away from the transistor T1 into the reference supply $V_{ref}$ via the switch S6. If this switch is given a low "on" resistance, the capacitance $C_N$ is charged to the voltage $V_{dd}-V_{ref}$ very quickly and the period sh1 can be made short with very little impact on the period remaining in phase $\phi 1b$ for settling. In practice very low "on" resistance is achieved by making the switch width to length ratio large with consequent increase in capacitance. In order to avoid this a smaller width to length ratio is chosen with the result that some of the charging current leaks through the switch S4 which is also closed in phase sh1. As the switch S7 is also closed during sh1 most of this leakage current is diverted into the reference supply $V_{ref}$. The combination of these two extra switches prevents almost all of the charging current of capacitor $C_N$ from reaching the gate capacitance of the transistor T1. The result is that the gate and drain electrodes of the fine memory transistor T2 are each held at the reference voltage $V_{ref}$ and the current $I_p$ through transistor T2 is equal to J during the phase sh1. Once sh1 is complete the memory transistor T2 may settle in the normal manner from the current $I_p$ =J towards the current $I_p$ =J+$\delta i$. Consequently, the fine memory cell behaves as though $C_N$ is equal to 0, except for the small loss of time sh1 from the phase $\phi 1b$.

Figure 5:
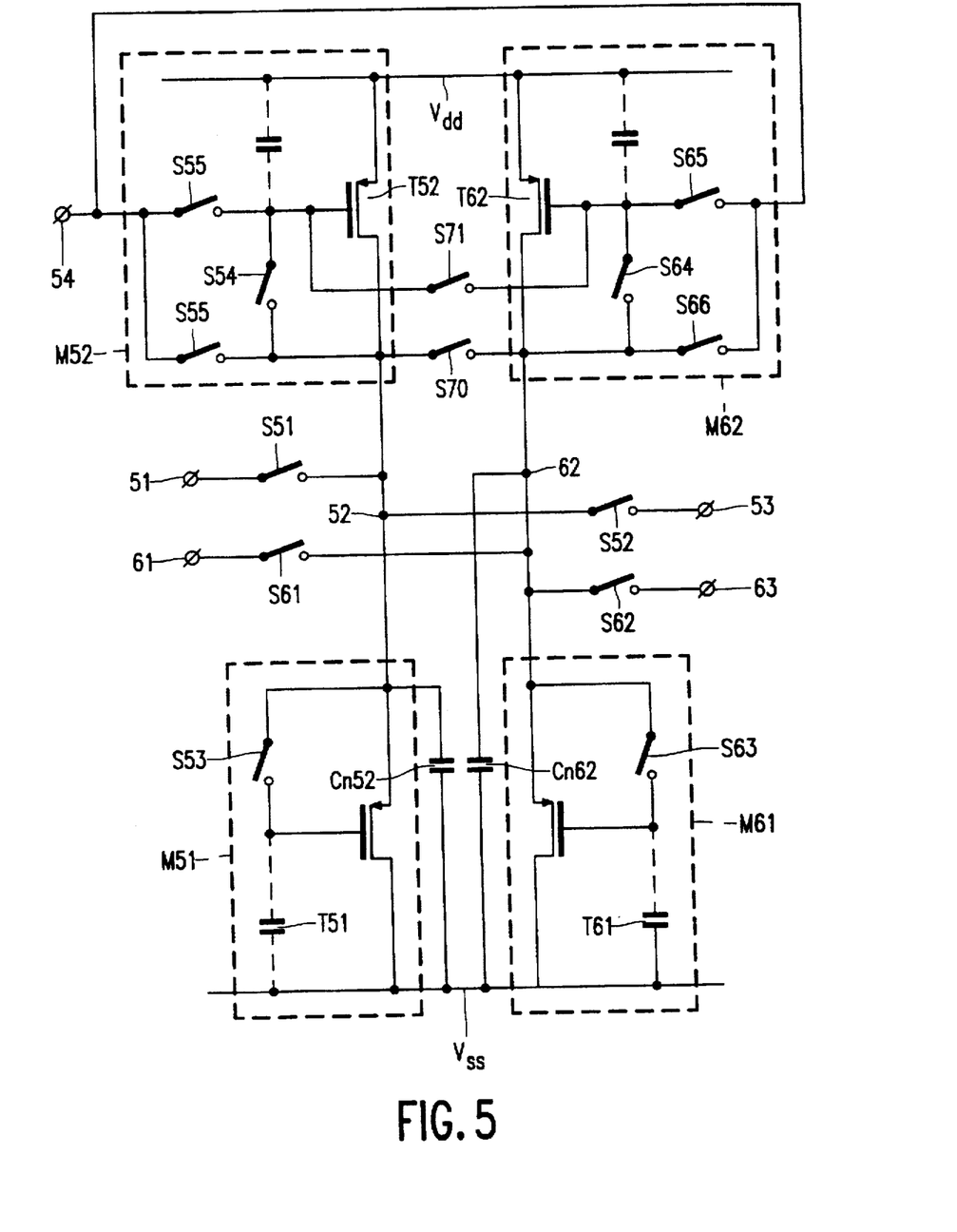
FIG. 5 is a circuit diagram of a second embodiment of a current memory according to the invention.

FIG. 5 illustrates how this invention is applied to a balanced current memory. The balanced current memory comprises a first current memory including a coarse memory cell M51 and fine memory cell M52 and a second current memory comprising a coarse current memory cell M61 and a fine current memory cell M62. The current memory has two inputs 51 and 61 for receiving balanced input currents. The input 51 is fed via a switch S51 to a summing node 52. The summing node 52 is connected via a switch S52 to an output 53. Similarly an input 61 is fed through a switch S61 to a summing node 62, the summing node 62 being connected to an output 63 via a switch S62. The coarse current memory cell M51 which forms part of the first current memory comprises an N-channel field effect transistor T51 whose source electrode is connected to a supply rail $V_{ss}$ and whose drain electrode is connected to the summing node 52. A switch S53 is connected between the gate and drain electrodes of transistor T51. The fine current memory cell M52 comprises a P-channel field effect transistor T52 whose source electrode is connected to a supply rail $V_{dd}$ and whose drain electrode is connected to the summing node 52. A switch S54 is connected between the gate and drain electrodes of transistor T52, while a switch S55 is connected between the gate electrode of transistor T52 and a terminal 54 to which a voltage reference source $V_{ref}$ is connected. Similarly the current memory comprises a coarse memory cell M61 which consists of an N-channel field effect transistor T61 whose source electrode is connected to the supply rail $V_{ss}$ and whose drain electrode is connected to a summing node 62. A switch S63 is connected between the gate and drain electrodes of transistor T61. The fine current memory cell M62 comprises a P-channel field effect transistor T62 whose source electrode is connected to the supply rail $V_{dd}$ and whose drain electrode is connected to the summing node 62. A switch S64 is connected between the gate and drain electrodes of transistor T62 while the gate electrode of T62 is connected via a switch S65 to the bias reference potential $V_{ref}$. The node 52 is further connected to the bias reference potential $V_{ref}$ via a switch S56 and the node 62 is further connected to the bias reference potential $V_{ref}$ via a switch S66. The references $C_N$ 52 and $C_N$ 62 refer to the parasitic capacitance at the nodes 52 and 62 respectively. The switches S56 and S66 correspond to the switch S6 in the embodiment of FIG. 3. With the balanced current memory cell two further switches S70 and S71 are provided. Switch S70 connects the two summing nodes 52 and 62 while switch S71 connects the gate electrodes of transistors T52 and T62.

In the embodiment shown in FIG. 5 the switches S51 and S61 are controlled by the waveform $\phi 1$, the switches S52 and S62 are controlled by the waveform $\phi 2$, Switches S53, S55, S63 and S65 are all controlled by the waveform $\phi 1a$, and switches S54 and S64 are controlled by the waveform $\phi 1b$. Switches S56 and S66 are controlled by the waveform sh1. The switches S70 and S71 are also controlled by the waveform sh1. In this balanced arrangement the switch S70 connects the nodes 52 and 62 for the short initial period sh1 at the start of the $\phi 1b$ period. This causes the parasitic capacitances $C_N$ 52 and $C_N$ 62 to discharge into each other since one will assume a voltage above $V_{ref}$ and the other a voltage below $V_{ref}$ if balanced currents are applied. The switch S71 is also closed during the period sh1 and causes the storage capacitors on transistors T52 and T62 to assume identical voltages, nominally $V_{ref}$. Any divergence from these values on the gate source capacitances of transistors T52 and T62 will tend to be equally offset about the potential $V_{ref}$. Thus the discharge currents of the parasitic capacitors at the summing nodes resulting from the balanced component of the input signal can be diverted by connecting the two nodes cells together. The additional switches S56 and S66 connected between the nodes 52 and 62 and the bias reference source $V_{ref}$ serve to divert the charging current resulting from the common mode component of the voltage changes at the summing nodes.

It is possible to design an S21 memory such that under quiescent conditions any of the following conditions apply.

1. $V_{gsN}+V_{gsP}=V_{dd}$
2. $V_{gsN}+V_{gsP}>V_{dd}$
3. $V_{gsN}+V_{gsP}<V_{dd}$ where $V_{gsN}$ is the gate-source potential of the N-channel transistor T1 and $V_{gsP}$ is the gate-source potential of the P-channel transistor T2.

In the first case there will be no common mode voltage assuming perfectly balanced input currents, while in the second and third cases there will be a common mode voltage jump from phases φ1a to φ1b. Clearly in the second and third cases there will be an advantage in providing switches S56 and S66.

Figure 6:
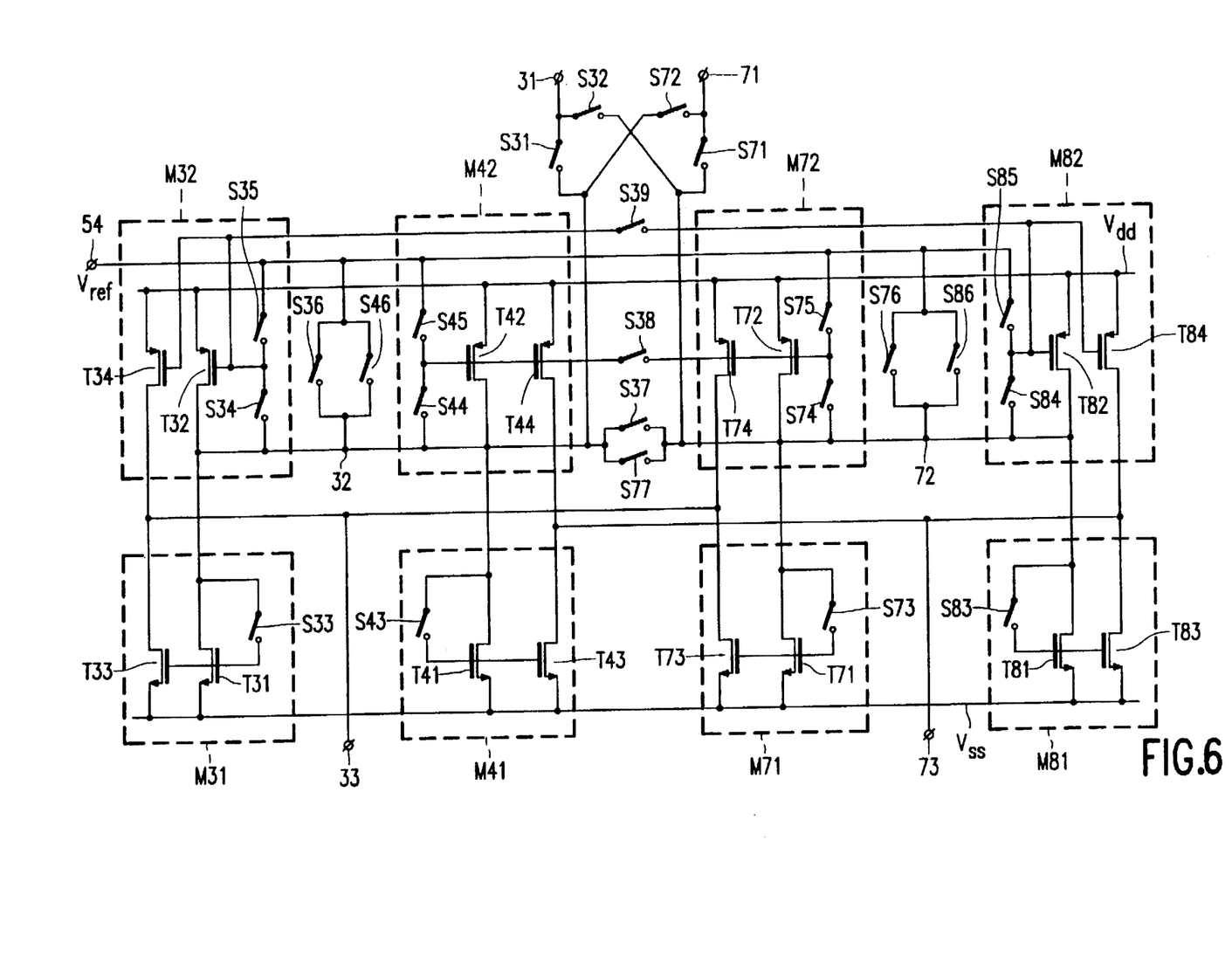
FIG. 6 is a circuit diagram of an integrator using current memories as shown in FIG. 5.

FIG. 6 shows a balanced integrator to which the inventive technique has been applied. The integrator has first and second inputs, 31 and 71. The input 31 is connected via a switch S31 to a summing node 32, while the input 71 is connected via a switch S71 to a summing node 72. The summing node 32 provides the input and first output of two interconnected current memories, the first comprising a coarse memory cell M31 and a fine memory cell M32 and a second coarse memory cell M41 and fine memory cell M42. The current memory cell M31 comprises an N-channel field effect transistor T31 which has its source electrode connected to a supply rail $V_{ss}$ and its drain electrode connected to the summing node 32. A switch S33 is connected between the gate and drain electrodes of transistor T31. In addition a further N-channel field effect transistor T33 has its source electrode connected to the supply rail $V_{ss}$ and its gate electrode connected to the gate of transistor T31. The drain electrode of transistor T33 is connected to an output 33 of the integrator. The fine current memory cell M32 comprises a P-channel field effect transistor T32 whose source electrode is connected to a supply rail $V_{dd}$ and whose drain electrode is connected to the summing node 32. The gate and drain electrodes of transistor T32 are connected via a switch S34 while the gate electrode of transistor T32 is connected to the bias reference voltage $V_{ref}$ via a switch S35. A further P-channel field effect transistor T34 has its source electrode connected to the supply rail $V_{dd}$ and its gate electrode connected to the gate electrode of transistor T32. The drain electrode of transistor T34 is connected to a first output 33 of the integrator. Also connected to the node 32 is a coarse current memory cell M41 which comprises an N-channel field effect transistor T41 whose source electrode is connected to the supply rail $V_{ss}$ and whose drain electrode is connected to the node 32. A switch S43 is connected between the gate and drain electrodes of transistor T41. A further N-channel field effect transistor T43 has its source electrode connected to the supply rail $V_{ss}$ and its gate electrode connected to the gate electrode of transistor T41. The drain electrode of transistor T43 is connected to an output 73 of the integrator. Also connected to the node 32 is a fine current memory cell M42 which consists of a P-channel field effect transistor T42 whose source electrode is connected to the supply rail $V_{dd}$ and whose drain electrode is connected to the node 32. A switch S44 is connected between the gate and drain electrodes of transistor T42 while a switch S45 is connected between the gate electrode of transistor T42 and the bias voltage source $V_{ref}$. A further P-channel field effect transistor T44 has its source electrode connected to the supply rail $V_{dd}$ and its gate electrode connected to the gate electrode of transistor T42. The drain electrode of transistor T44 is connected to the output 73 of the integrator.

The node 72 is connected to two further current memories, the first comprising a coarse current memory cell M71 and a fine current memory cell M72 and the second comprising a coarse current memory cell M81 and a fine current memory cell M82. The current memory cell M71 comprises an N-channel field effect transistor T71 whose source electrode is connected to the supply rail $V_{ss}$ and whose drain electrode is connected to the node 72. A switch S73 is connected between the gate and drain electrodes of transistor T71. A further N-channel field effect transistor T73 has its source electrode connected to the supply rail $V_{ss}$ and its gate electrode connected to the gate electrode of transistor T71. The drain electrode of transistor T73 is connected to the output 33 of the integrator. The fine current memory cell M72 consists of a P-channel field effect transistor T72 whose source electrode is connected to the supply rail $V_{dd}$ and whose drain electrode is connected to the node 72. A switch S74 is connected between the gate and drain electrodes of transistor T72 while a switch S75 is connected between the gate electrode of transistor T72 and the bias voltage reference $V_{ref}$. A further P-channel field effect transistor T74 has its source electrode connected to the supply rail $V_{dd}$ and its gate electrode connected to the gate electrode of transistor T72. The drain electrode of transistor T74 is connected to the output 33 of the integrator. The second current memory comprises a coarse current memory cell M81 which consists of an N-channel field effect transistor T81 whose source electrode is connected to the supply rail $V_{ss}$ and whose drain electrode is connected to the node 72. A switch S83 is connected between the gate and drain electrodes of transistor T81. A further N-channel field effect transistor T83 has its source electrode connected to the supply rail $V_{ss}$ and its gate electrode connected to the gate electrode of transistor T81. The drain electrode of transistor T83 is connected to the output 73 of the integrator. The fine current memory cell M82 consists of a P-channel field effect transistor T82 whose source electrode is connected to the supply rail $V_{dd}$ and whose drain electrode is connected to the summing node 72. A switch S84 is connected between the drain and gate electrodes of transistor T82 while a switch S85 is connected between the gate electrode of transistor T82 and the bias reference source $V_{ref}$. A further P-channel field effect transistor T84 has its source electrode connected to the supply rail $V_{dd}$ and its gate electrode connected to the gate electrode of transistor T82. The drain electrode of transistor T84 is connected to the output 73 of the integrator. A further switch S32 is connected between the input 31 and the node 72 while a switch S72 is connected between the input 71 and the node 32.

Switches S31 and S71 are operated by the clock waveform φ1, switches S33, S35, S83 and S85 are operated by the clock waveform φ1a, Switches S34 and S84 are operated by the clock waveform φ1b, switches S43, S45, S73 and S75 are operated by the clock waveform φ2a, while switches S44 and S74 are operated by the clock waveform φ2b. Switches S32 and S72 are operated by the clock waveform φ2.

Thus far the arrangement described shows a balanced integrator as disclosed in EP-A-0642095A (PHB 33875). In order to overcome the problems associated with the stray capacitance at the nodes 32 and 72 causing increased settling time for the fine current memory cells M32, M42, M72 and M82 a number of further switches are provided. A switch M36 is connected between the node 32 and the bias reference source $V_{ref}$. A further switch S46 is connected between the node 32 and the bias reference source $V_{ref}$. Similarly two further switches S76 and S86 are connected between the node 72 and the bias reference source $V_{ref}$. Two further switches S37 and S77 are connected between the nodes 32 and 72 while a switch S38 is connected between the gate electrodes of the transistors T44 and T74 and a further switch S39 is connected between the gate electrodes of transistors T34 and T84. Switches S36, S37, S39 and S76 are closed under the control of the short pulse sh1 while switches S46, S77, S86 and S38 are closed under the control of the short pulse signal sh2. A brief consideration of the circuit arrangement shown in FIG. 6 will reveal that switch S36 corresponds to switch S56 of FIG. 5 while S46 corresponds to switch S66 in FIG. 5. Similarly, switch S76 corresponds to switch S56 in FIG. 5, while switch S86 corresponds to switch S66 in FIG. 5. It will be seen that switches S37 and S77 correspond to switch S70 in FIG. 5, while switches S38 and S39 correspond to the switch S71. As a result by forming the integrator in this manner the effect of the node capacitance on the settling time is reduced. Clearly the pairs of switches S36, S46; S76, S86; and S37, S77 could each be replaced by a single switch which is closed by both waveforms sh1 and sh2.

From reading the present disclosure, other modifications will be apparent to persons skilled in the art. Such modifications may involve other features which are already known in the design and use of electrical or electronic circuits and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation of one or more of those features which would be obvious to persons skilled in the art, whether or not it relates to the same invention as presently claimed in any claim and whether or not it mitigates any or all of the same technical problems as does the present invention.

We claim:

1. An analogue current memory comprising: a first, coarse, current memory cell comprising a first field effect transistor having a first switch connected between its drain and gate electrodes, and a second, fine, current memory cell comprising a second field effect transistor having a second switch connected between its drain and gate electrodes and a third switch connected between its gate electrode and a bias potential source, means for applying an input current to be stored to inputs of the first and second current memory cells, means for applying output currents from the first and second current memory cells to a summing node, and means for deriving a stored current from the summing node, wherein the first and third switches are closed for a first period during the application of the input current and the second switch is closed for a second period during the application of the input current; wherein the current memory further comprises means for providing a discharge path for a capacitance at the summing node for an initial portion of the second period, said discharge path causing at least some of the charge on said capacitance to be discharged other than through the second transistor.

2. A current memory as claimed in claim 1 in which the means for providing a discharge path comprises the second and third switches, the third switch being closed for the initial portion of the second period.

3. A current memory as claimed in claim 2 in which the means for providing a discharge path comprises a fourth switch which is closed for the initial portion of the second period, the fourth switch being connected between the bias potential source and the summing node.

4. A current memory as claimed in claim 3 comprising a fifth switch connected in parallel with the third switch, the fifth switch being closed for the initial portion of the second period.

5. An analogue current memory for differential input currents comprising first and second current memories as claimed in claim 1 in which a discharge path for the capacitance at the summing nodes of the first and second current memories is provided by connecting together the summing nodes of the first and second current memories for the initial portion of the second period.

6. An integrator including two coupled current memories as claimed in claim 1.

7. A current memory as claimed in claim 1 in which the means for providing a discharge path comprises a fourth switch which is closed for the initial portion of the second period, the fourth switch being connected between the bias potential source and the summing node.

8. A current memory as claimed in claim 7 comprising a fifth switch connected in parallel with the third switch, the fifth switch being closed for the initial portion of the second period.

9. A current memory as claimed in claim 2 comprising a fourth switch connected in parallel with the third switch, the fourth switch being closed for the initial portion of the second period.

10. A current memory as claimed in claim 1 comprising a fourth switch connected in parallel with the third switch, the fourth switch being closed for the initial portion of the second period.

11. A current memory as claimed in claim 7 further comprising a fifth switch coupled between a terminal for receiving the input current and said summing node and a sixth switch coupled between an output terminal of the current memory and said summing node, wherein said fifth switch is closed during said first period and said sixth switch is closed during said second period.

12. A current memory as claimed in claim 5 further comprising a fourth switch coupling the summing node of the first current memory to the summing node of the second current memory, and a fifth switch coupling a control electrode of the second transistor of the first current memory to a control electrode of the second transistor of the second current memory, wherein the fourth and fifth switches are closed during said initial portion of the second period.

13. A current memory as claimed in claim 7 wherein said first and second field effect transistors are connected in series circuit between the first and second terminals of a source of DC supply voltage and said summing node comprises a circuit point between the first and second series connected field effect transistors.

14. A current memory as claimed in claim 1 wherein said capacitance comprises a parasitic capacitance present between the summing node and a circuit point of reference voltage.

* * * * *